Figure 1:
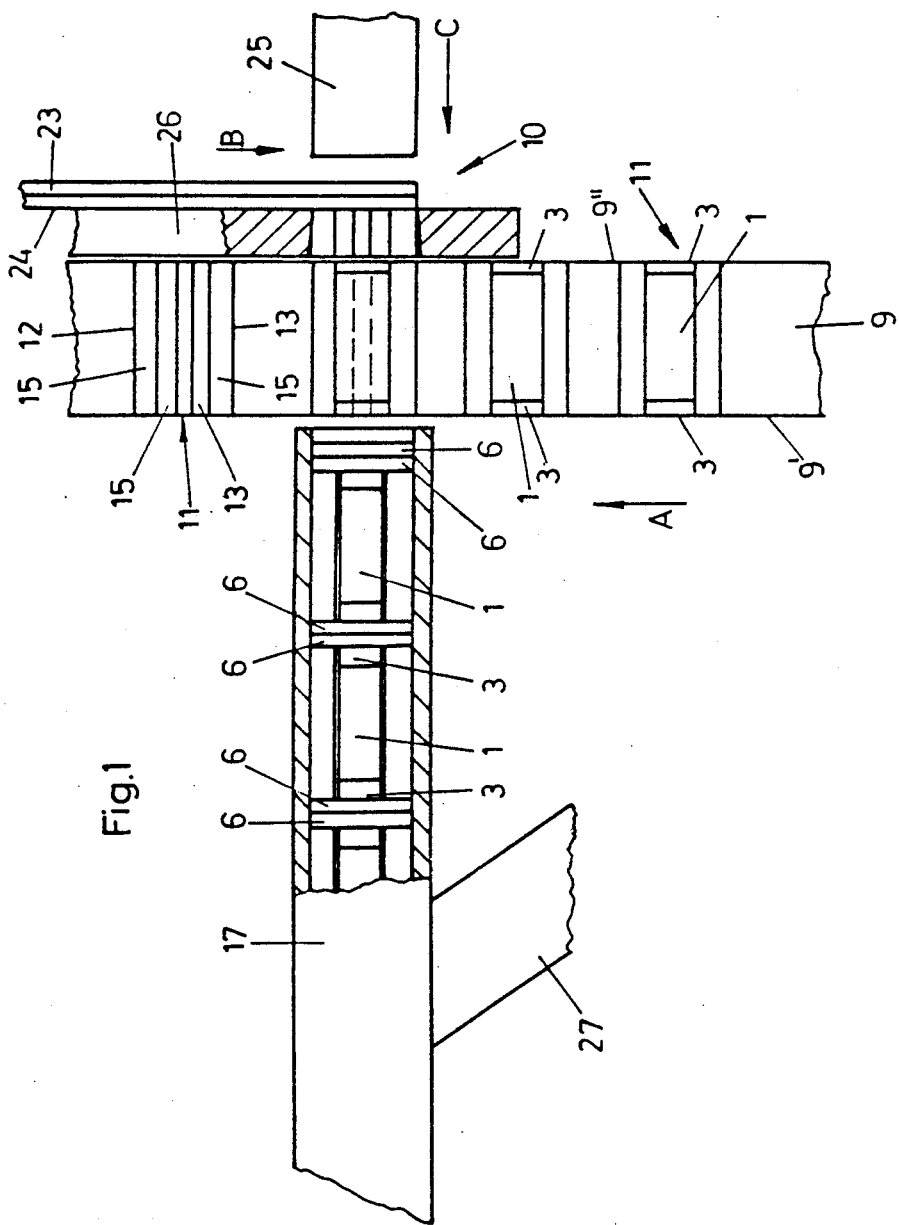

United States Patent [19]

Sillner

[11] Patent Number: 4,968,377
[45] Date of Patent: Nov. 6, 1990

[54] METHOD AND APPARATUS FOR SHAPING CYLINDRICAL ELECTRICAL PARTS

[76] Inventor: Georg Sillner, Buchenstrasse 23, 8411 Zeitlarn, Fed. Rep. of Germany

[21] Appl. No.: 263,446

[22] Filed: Oct. 27, 1988

[51] Int. Cl.$^5$ .............................................. B29C 65/70
[52] U.S. Cl. ...................... 156/245; 156/500; 29/619; 29/841; 29/856; 29/858; 264/259; 264/261; 264/262
[58] Field of Search ............... 156/245, 500; 264/259, 264/261, 262, DIG. 76; 29/829, 831, 832, 841, 856, 858, 613, 619

[56] References Cited

U.S. PATENT DOCUMENTS

| | | | |
|---|---|---|---|
| 1,877,352 | 9/1932 | Megow | 29/619 |
| 2,496,346 | 2/1950 | Haayman et al. | 29/619 |
| 3,550,228 | 12/1970 | Asscher | 29/619 |
| 3,837,067 | 9/1974 | Johnston et al. | 29/619 |

FOREIGN PATENT DOCUMENTS

| | | |
|---|---|---|
| 0235025 | 9/1987 | European Pat. Off. |
| 1564625 | 6/1968 | Fed. Rep. of Germany |
| 1800192 | 4/1970 | Fed. Rep. of Germany |
| 2529428 | 12/1983 | France |
| 2555356 | 5/1985 | France |
| 2584887 | 1/1987 | France |

OTHER PUBLICATIONS

Handbook of Microelectronics Packaging and Interconnection Technologies, p. 48, et. seq.
Elektronik, "Automatische Bestucküng drahtloser Bauelemente", 12—13—85, Dipl.—Phys. Hartmut Steinberger, pp. 102-106.

Primary Examiner—Caleb Weston
Attorney, Agent, or Firm—Hoffman, Wasson, Fallow & Gitler

[57] ABSTRACT

A process for transforming a cylindrical electrical part into a component having at least one flat surface, suitable for use as a surface mounted device.

37 Claims, 5 Drawing Sheets

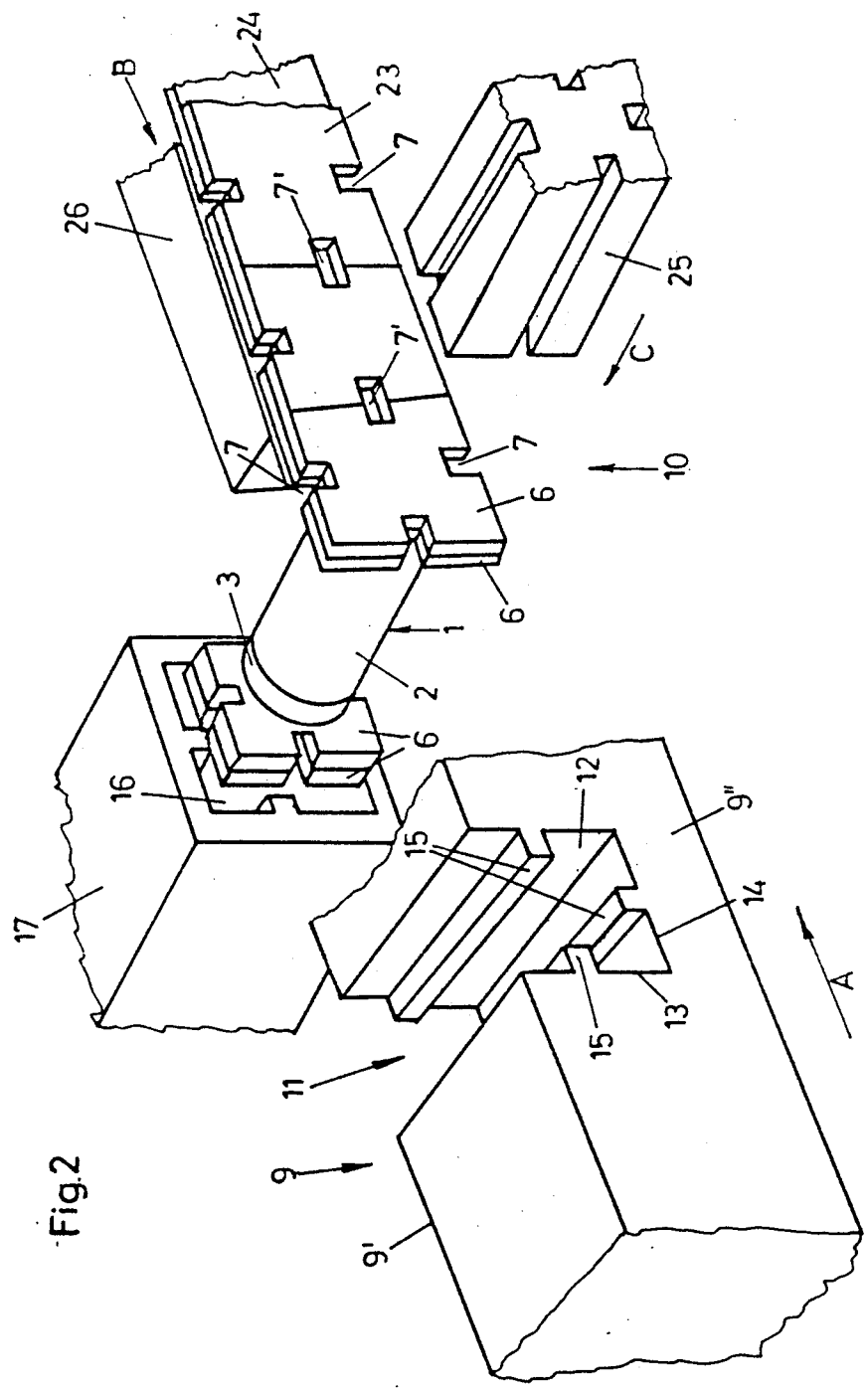

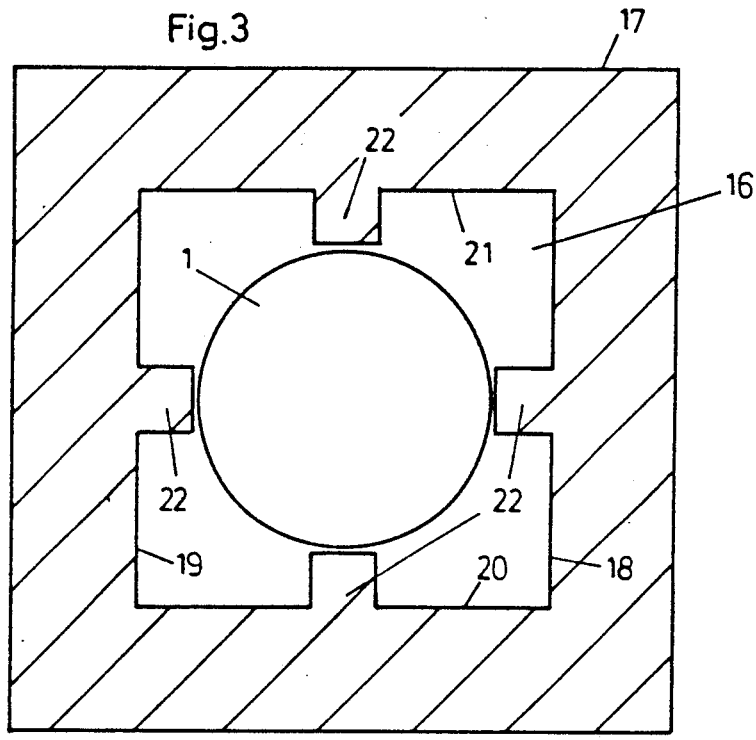
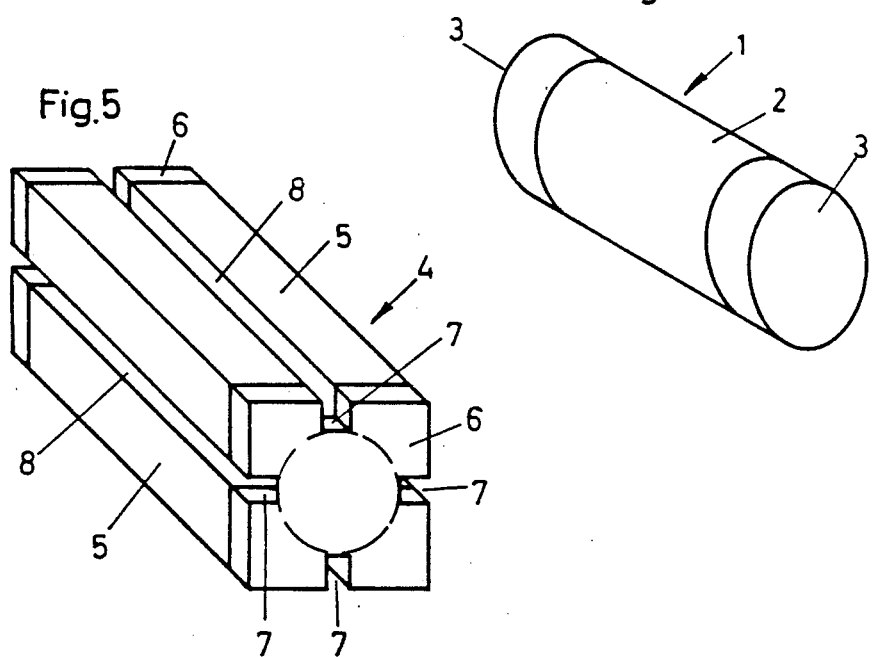

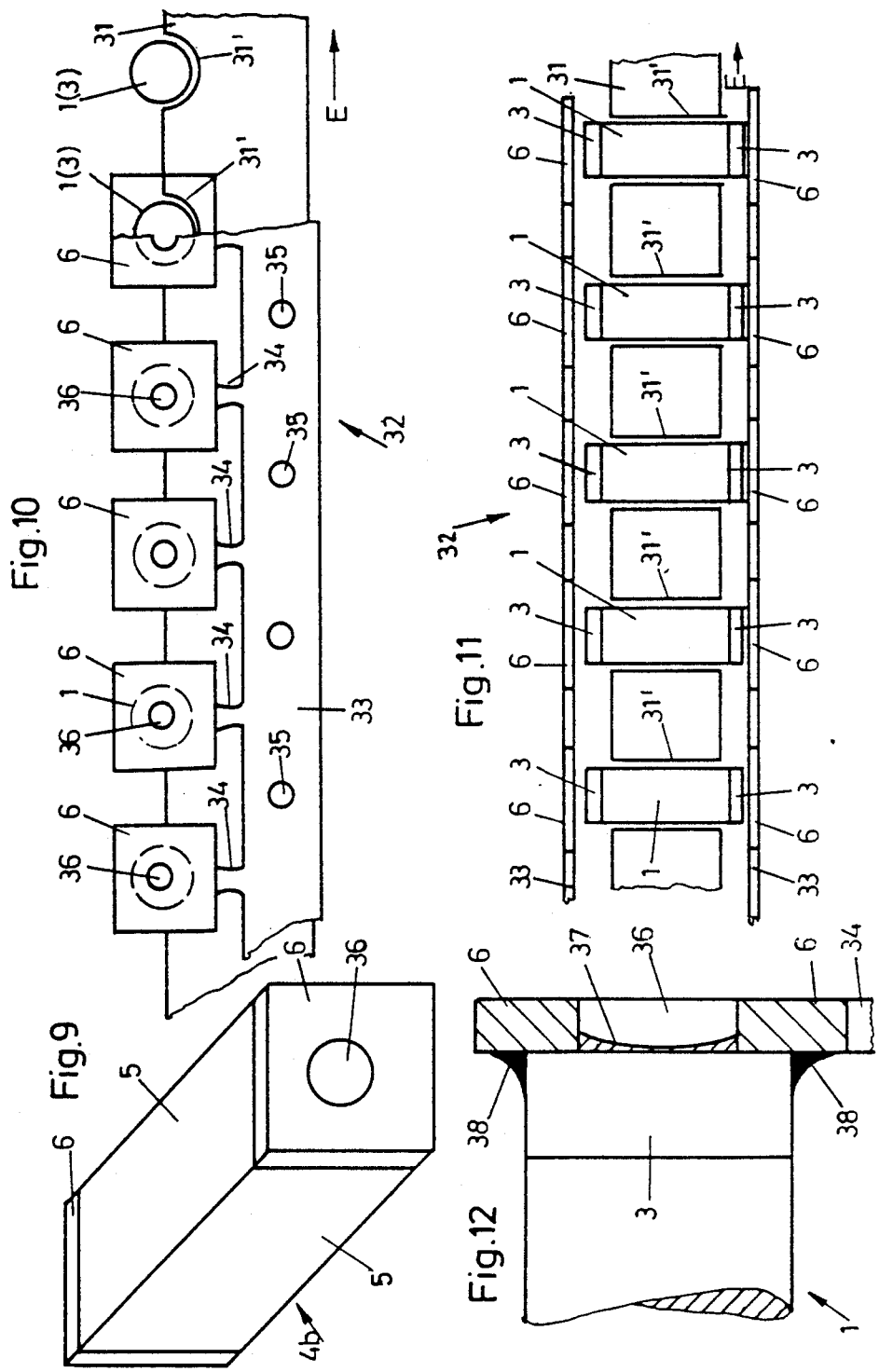

METHOD AND APPARATUS FOR SHAPING CYLINDRICAL ELECTRICAL PARTS

The invention relates to a process for shaping electric parts that are cylindrical or circular cylindrical into electric components whose peripheral surface exhibits at least one flat surface area or section.

Cylindrical electric parts are known in the most varied embodiments (as diodes, resistors, capacitors, etc) and are often also designated as "MELF." These parts belong to the group of so-called SMD parts (surface mounted devices) and are, among other things, processed for the production of electric circuits using printed boards so that these parts, to equip the printed boards in question, are placed on the latter and are preliminarily fastened there (for example with an adhesive coating). The electrical connection of these parts to the circuit board conductors of the printed circuit board then occurs in another process step by soldering so that the parts, with contact surfaces provided on their two ends in each case, are soldered directly to the circuit board conductors of the printed circuit board. The drawback here is, among other things, that the cylindrical parts, because of their shape, easily slip or curl up without preliminary fastening to the mother board, thus the fastening (for example with the help of an adhesive) is absolutely necessary for an orderly assembly of a printed circuit board; however, because of the cylindrical shape of the parts, such a fastening in the necessary way is not always guaranteed.

The object of the invention is to indicate a process or a device with which it is possible in a relatively simple way to transform these kinds of electrical parts into electrical components whose peripheral surface exhibits at least one flat surface area, to simplify in this way the assembly of an electrical circuit.

To achieve this object, a process is designed according to the characterizing part of claim 1 or a device according to the characterizing part of claim 23.

In that after the shaping or transformation, electrical components are obtained which, on their peripheral surface, exhibit at least one flat surface area, these components, which are also SMD parts, can be processed considerably more simply during assembly of an electrical circuit, i.e., the transformed components with at least the one flat surface area can be placed on the printed circuit board so that even, without a preliminary fastening before soldering, an orderly positioning of the components and thus an orderly assembly of the printed circuit board is possible. But the one flat surface area at least also provides the possibility of a considerably improved fastening in those cases in which a fastening before soldering is necessary or sought.

The metal plates attached on both ends of the electrical parts to be transformed constitute, in the reshaped component, the exposed contact surfaces of this component.

In one embodiment of the invention, the metal plates and the parts to be transformed are pushed into a mold or forming space into which, for example, the compound of electrically insulating material is next inserted which, after it hardens or sets, at least partially encloses not only the part after shaping but also constitutes at least the one flat surface area of the reshaped component. In this forming space, blanks consisting of parts and plates to be reshaped can also be constructed, blanks which, after removal from the forming space are inserted or put into a separate mold for applying the compound of electrically insulating material.

In another embodiment, the plates are fed to at least one support strip of a work position and connected there to the ends of the parts to be reshaped, and then the blanks thus obtained from at least one part and two plates in each case are inserted or put into a mold for applying the compound of electrically insulating material.

The electrical part to be reshaped can be a MELF or another part exhibiting a cylindrical body, e.g., a coil wound on a ferrite body, etc., so that it is also possible with the device according to the invention, for example, to produce inductors economically.

Further developments of the invention are the object of the subclaims.

Figure 6:
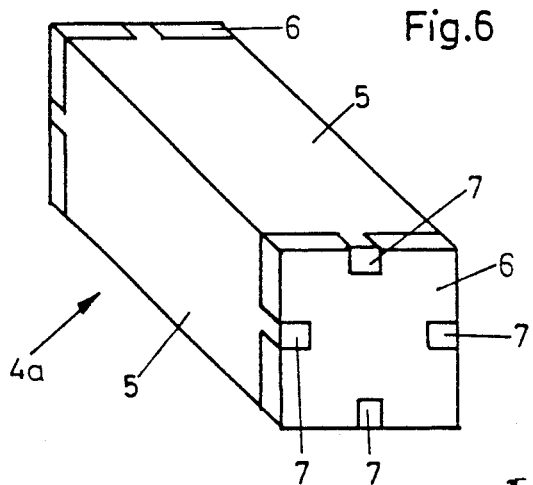
Figure 7:
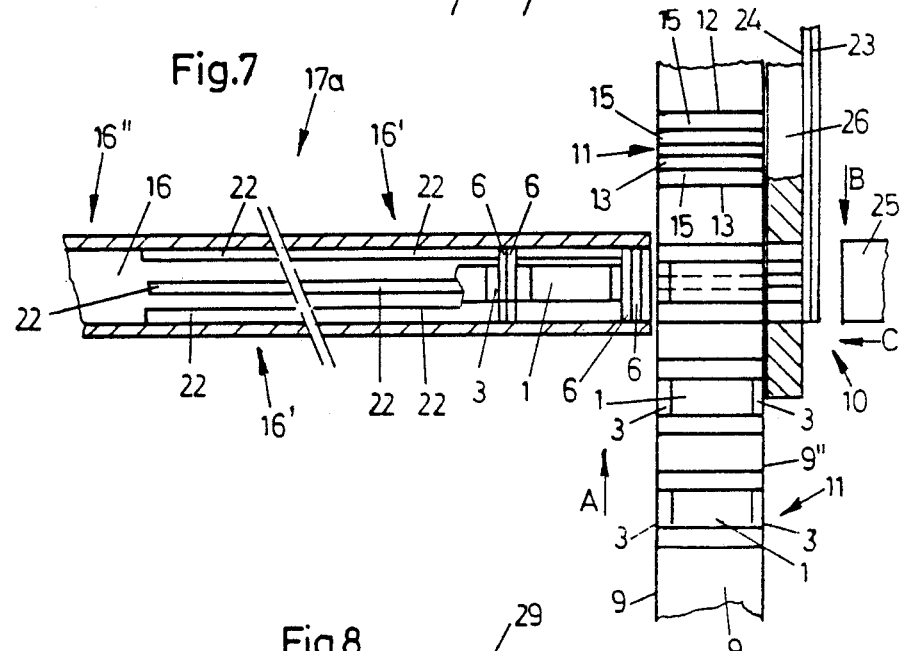
Figure 8:
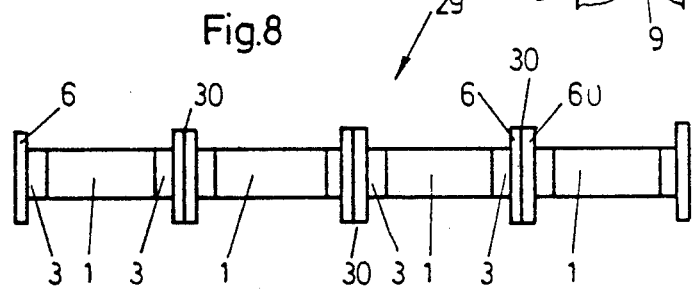

The invention is explained in further detail below based on the figures with one embodiment. Shown are:

FIG. 1, in simplified, diagrammatic representation and in a top view, a device for transforming parts (MELFs) into rectangular or square components;

FIG. 2, in simplified perspective representation, a partial view of the device according to FIG. 1;

FIG. 3, in a section through the core used for the application of the covering or compound of insulating material of the device according to FIG. 1;

FIG. 4, in simplified, perspective representation, a MELF part before transformation;

FIG. 5, in simplified, perspective representation, a component after the transformation;

FIG. 6, in a representation similar to FIG. 5, another component after transformation;

FIG. 7, in a simplified representation, a longitudinal section through a core for molding the component body of the component according to FIG. 6 in another embodiment of the device for transforming parts (MELFs) into rectangular or square components;

FIG. 8, in a side view, a rodlike blank consisting of plates and parts (MELFs) to be transformed;

FIG. 9, in a representation similar to FIG. 5, another component after transformation;

FIG. 10 and 11, in simplified, diagrammatic representation, the work station of another device for transforming parts (MELFs) into rectangular or square components according to FIG. 9, specifically in a side view and in a top view;

FIG. 12, in an enlarged, detail representation, the end of a MELF part connected to a plate.

In the figures, 1 is a MELF part that exhibits a component body 2 with a circular cylindrical shape which, on its two ends or faces, is in each case provided with a contact surface 3 constructed, for example, of a metal cap or produced in another suitable way. Such MELF parts, which can be active electrical parts (e.g., diodes) or also passive electrical parts (e.g., resistors or capacitors) are used especially for the production of electrical circuits with high part density, and it is usual to connect, by soldering, respective MELF part 1 on its contact surfaces 3 directly, for example, to the circuit board conductors of a printed circuit board that forms the basis of the circuit. Because of the circular cylindrical-shaped design of MELF parts 1, the latter must be fastened, with their peripheral surface lying on the printed circuit board, to the printed circuit board, for example by an application of adhesive, at least until soldering, which is complicated and, especially also because of the circular cylindrical shape, often not possible or only possible with difficulty in the necessary, reliable way.

In FIGS. 1 to 5, 4 designates a component which is produced according to the process according to the invention or with the device according to the invention in the simplest case from a MELF part 1 and which, in the embodiment represented, is produced square-shaped with an essentially square cross section, i.e., with a peripheral surface that exhibits four surface areas 5 that join each other in each case in the peripheral direction at a right angle. On its two ends, component 4 has in each case an essentially square plate 6 that is produced from a sheet metal and constitutes an exposed contact surface, a plate whose cross section dimensions or whose side lengths are somewhat larger than the cross section of MELF part 1. Each plate 6 is fastened to a front contact surface 3 of MELF part 1 so that the center of plate 6, which lies with its surface sides perpendicular to the axis of MELF part 1, lies in the axis of MELF part 1 and an electrical connection also exists between plate 6 and respective contact surface 3. To keep plates 6 on contact surfaces 3, for example a so-called "conductive adhesive" can be used, i.e., an adhesive that also produces, after hardening or setting, a galvanically conducting connection between respective contact surface 3 and plate 6 fastened to it. Of course, to connect plates 6 to contact surfaces 3 of MELF part 1, other techniques are conceivable. Both plates 6 are further fastened to both faces of MELF part 1 so that these plates each exhibit the same orientation, i.e., each side edge of a plate 6 lies parallel to one side edge of other plate 6. The space remaining between the two plates 6 is filled with a compound of electrically insulating material (plastic) that constitutes, outside plates 6, the body of component 4 that encloses MELF part 1 and is shaped so that component 4 has, between two plates 6, the square cross section that remains the same over the entire length of this component, exhibits surface areas 5, and is the same in its shape and size as the cross section of plates 6. In the same way as MELF part 1 for production of a circuit, component 4 is positioned on the printed circuit board used and, with the help of plates 6 that constitute the contact surfaces of component 4, is soldered directly to the circuit board conductors of the printed circuit board.

Component 4 is thus also a SMD, but due to flat surface areas 5, the positioning of component 4 on the printed circuit board and, above all, maintaining the respective position until establishment of the solder connection are considerably simpler than with MELF part 1. With a suitable handling of the assembled printed circuit board, sometimes when using components 4 their preliminary fastening to the printed circuit board can be completely dispensed with.

As shown especially in FIG. 5, each plate 6 exhibits 4 recesses 7, one each is provided in the middle of each peripheral side of plate 6 in question and is open toward this peripheral side. The recesses which, in the embodiment represented, are constructed essentially rectangular and are placed distributed at even angular distances around the axis of MELF part 1 have in each case a depth such that each recess ends at the peripheral surface of MELF part 1. As explained further below recesses 7, necessary auxiliary means for the production of component 4, constitute in each case the front, open end of a longitudinal groove 8 provided on surface areas 5 and also open toward the periphery of component 4. Corresponding to the number of recesses 7, such a longitudinal groove 8 is provided on each surface area 5.

FIGS. 1 to 3 reflect, in diagrammatic representation, a device that makes possible in an especially simple way the transformation of MELF parts 1 into components 4.

This device first exhibits a transport element 9, which moves in cycles past a work position 10 and feeds MELF parts 1 from a stock, which is not shown in more detail and which exhibits a multiplicity of such parts, individually, i.e., one after another, to work position 10. For this purpose, transport element 9 has several groove-shaped recesses 11 which constitute in each case a support for a MELF part 1 and which, with their longitudinal extension, are oriented perpendicular to movement direction A of transport element 9 and are open on both sides 9' and 9" of transport element 9 that run in movement direction A and in the embodiment represented also on the top side of transport element 9. Each recess 11 has a cross section that is matched to the cross section of plates 6, i.e., essentially square in the embodiment represented, with two surfaces 12 and 13 that border respective recess 11 laterally in each case and lie perpendicular to movement direction A and with a surface 14 lying perpendicular to surface 12 and 13 and constituting the floor of respective recess 11. On each of surfaces 12 to 14, a striplike projection 15 projecting into recess 11 and perpendicular to movement direction A is provided so that the arrangement exhibited by projections 15 relative to each other on the surfaces mentioned is the same as the arrangement of recesses 7 on three consecutive peripheral sides of plates 6. By projections 15, each MELF part 1 conveyed to work position 10 is kept in suitable recess 11 so that this component, with its axis perpendicular to movement direction A, exhibits in each case the same distance from surfaces 12 to 14. Perpendicular to the movement direction and in the direction of the longitudinal extension of recesses 11, transport element 9 has, at least in the area of these recesses, a width that is approximately the same as the length of MELF parts 1.

A stationary core 16 ends at work position 10 on the one side of transport element 9, specifically in the representation selected for FIG. 2 on rear side 9', a core that constitutes a mold and forming space, lies with its longitudinal extension perpendicular to movement direction A and, for example, is constructed inside a pipelike element 17. Core 16 has a square cross section that is matched to the cross section of plates 6, a cross section that is constructed of four inner surfaces 18 to 21 that join each other in each case at right angles. On each inner surface 18 there is provided a flangelike projection 22 that projects into core 16 and extends in the longitudinal direction of this core, and these projections correspond in their cross section and their arrangement to the size and arrangement of recesses 7 on plates 6, i.e., each projection 22 is provided in each case in the middle of respective inner surface 18 to 21 and is constructed in cross section perpendicular to the longitudinal extension of core 16 so that it completely or almost completely fills up a recess 7 in each case.

The arrangement of transport element 9 relative to core 16 and the drive for transport element 9 are selected so that in every stoppage phase of cycle-driven transport element 9 a recess 11 coincident with core 16 so that not only does this recess with its surfaces 12 to 14 continue without transition in inner surfaces 18 to 20 of core 16, but also every projection 15 continues in a projection 22 of core 16.

Two metal material strips 23 and 24 are fed in the direction f arrow B to work position 10 on side 9" lying opposite core 16 with the aid of a conveying device, not shown in more detail, so that these material strips, resting with one surface side in each case flat against each other, are oriented with their surface sides perpendicular to the longitudinal extension of recesses 11. Material strips 23 and 24, from which plates 6 are generated by separation, are already precut with recesses 7 on their longitudinal sides running in conveying direction B. In the middle, each material strip exhibits a multiplicity of rectangular recesses 7', which form a row of holes or perforation extending in the longitudinal direction of the material strip in question, and each recess 7' is provided in the longitudinal direction of the material strip in question between two recesses 7 provided on the longitudinal sides of this material strip 23 or 24 and further has, in the longitudinal direction of the material strip, a cross section dimension that is twice as large as the depth of recesses 7. Both material strips 23 and 24 are fed further to work position 10 so that they are placed to coincide on recesses 7 and 7'.

At work position 10, where material strips 23 and 24 are fed, a punching or cutting device is further provided which essentially consists of a ram 25 that can be moved back and forth in a direction perpendicular to movement direction A and of a stationary pressure pad 26, constructed for example of a matrix.

The method of operation of the device according to FIGS. 1 to 3 can be described as follows:

Each MELF part 1 placed in a recess 11 of transport element 9 is provided, before reaching work position 10, with a conductive adhesive coating on both front contact surfaces 3. Whenever a recess 11 exhibiting a MELF part 1 has reached work position 10, by moving ram 25 in the direction of arrow C, a front section each that forms a plate 6 is separated from each material strip 23 and 24, and the separation occurs in the middle of recesses 7'. Two plates 6, thus produced from material strips 23 and 24 and lying on each other like a stack, are then brought to lie against contact surface 3 adjacent to side 9" of transport element 9, and plate 6 obtained from material strip 24 rests directly against contact surface 3 in question of MELF part 1 and can enter into an adhesive bond with this contact surface 3, while plate 6 obtained from material strip 23 rests only by flat contact against plate 6 obtained from material strip 24. By further movement of ram 25 in the direction of arrow C, MELF part 1 is then pushed, together with two plates 6 obtained from material strips 23 and 24, into core 16, and plates 6, by projections 15 or 22 engaging in recesses 7, are guided precisely and are secured against tipping or tilting during movement along recess 11 and during movement inside core 16.

In the next work cycle, i.e., when a recess 11 of transport element 9 has again reached work position 10, two plates 6 are again separated from two material strips 23 and 24 and, together with MELF part 1 in question, they are pushed through recess 11 into core 16, and MELF part 1, with its face that is in front during this insertion and that is provided with the conductive adhesive, comes to rest against that plate 6 which was obtained from material strip 23 during the preceding work cycle. It is understood that after every insertion of a MELF part 1 and both plates 6, ram 25 in each case is moved back into its starting position opposite arrow C.

In the way described, core 16 is thus filled with MELF parts 1 and in each case two plates 6 lying between each part, and at every work cycle MELF parts 1 and plates 6 located in core 16 are pushed farther. A feed core 27 empties at a distance from transport element 9 into core 16, a feed core by which the plastic compound that constitutes the component bodies of component 4 is fed, so that after going through this feed core 27, MELF parts 1 provided between plates 6 are covered by the plastic compound, also resulting in the desired cross section shape for components 4 by the cross section of core 16. At a distance from feed core 27, core 16 exhibits an outlet, at which components 4 then leave core 16 after hardening of the plastic compound and can be conveyed away, for example with the aid of a transport element.

Transport element 9 is, for example, a conveyor band or a conveyor belt, preferably a wheel rotating in the direction of arrow A that exhibits, on its peripheral surface, recesses 11 distributed at even angular distances.

The process or device described above can also be used like the processes and devices described below for producing inductors, and then instead of a MELF part, a body is used that corresponds to component body 2, consists at least partially of ferromagnetic material and is provided with a winding.

FIG. 6 shows a component 4a which is obtained by shaping using plates 6 and MELF part 1 and which differs from component 4 in that component 4a does not have longitudinal grooves 8, i.e., part 4a is constructed, on its surface areas 5, completely flat, without interruption by longitudinal groove 8 in each case, and the plastic compound that envelops MELF part 1 and constitutes surface areas 5 also extends into recesses 7 of both plates 6 or fills these recesses. Component 4a which, because of surface areas 5 that are uninterrupted by longitudinal grooves 8, is especially suitable also for processing with suction grippers, is produced in the same way as component 4 with the help of the device according to FIGS. 1 to 3, thus in the way described above by shaping, but with the difference that the holding tool that forms the peripheral surface, i.e., surface areas 5 of component 4a does not exhibit flangelike projections 22.

To produce component 4a, plates 6 punched out of material strips 23 and 24 and the MELF components fed by transport element 9 are pushed in the same way as was described for the embodiment according to FIGS. 1 to 5, in each case consecutively into core 16 of pipelike element 17a which, with respect to its function and arrangement relative to the remaining parts of the device, corresponds to pipelike element 17 of FIGS. 1 to 3. MELF components 1 here are again provided, on their front contact surfaces 3 that rest against plates 6, with the conductive adhesive, so that a connection is established between each contact surface 3 and plate 6 directly adjacent to it. Core 16 exhibits (starting from its end lying adjacent to transport element 9), over a certain length, flangelike projections 22, so that over this length and by flangelike projections 22, plates 6 and MELF parts 1 are kept in the correct orientation also with respect to each other, as this was described above in connection with FIGS. 1 to 3. The length of part 16' of core 16 provided with flanges 22 is (also when considering the setting or hardening time of the conductive adhesive used and considering the maximum possible output of the device, i.e., considering the maximum processed measuring components 1 per unit of time) selected so that whenever a MELF component 1 with its respective plates 6 has reached this core by further pushing the end of part 16' in core 16, MELF part 1 is already fastened sufficiently solidly to respective plates 6 by sticking. A part 16" of core 16 joins part 16' in the movement direction of MELF parts 1 and of plates 6 connected to the latter, and in part 16", with otherwise the same cross section as core 16, projections 22 are missing. Into this part 16" there then empties feed core 27, by which the plastic compound that constitutes the component body of component 4a is fed. After passing through this feed core 27, MELF parts 1 then provided between plates 6 are covered with the plastic compound, and by the cross section that core 16 exhibits in part 16", and especially by the lack there of projections 22, the desired cross section shape of components 4a is obtained without longitudinal grooves 8.

But components 4a can also be produced with the device according to FIGS. 1 to 3 in that the covering of MELF components 1 with the plastic compound occurs not inside core 16, but with set or hardened conductive adhesive and thus with MELF parts 1 connected to plates 6 outside core 16 and preferably by molding under pressure in a separate mold that exhibits the flat mold surfaces that mold surface areas 5.

According to FIG. 8, here it is preferable to proceed so that, using the device according to FIGS. 1 to 3, a rodlike blank 29 is produced in which two plates 6 follow each MELF component 1 in each case and which terminates at both ends with one plate 6 in each case. Each plate 6 is again connected, with the aid of the conductive adhesive, to front contact surface 3 on an end of a MELF component 1. Further, in rodlike blank 29, plates 6 that follow each other directly are connected to each other on their surface sides facing each other by a fastener, as this is indicated in FIG. 8 by the certainly exaggerated and thick layers 30 represented there of this fastener. Blank 28 is then inserted as a whole into a mold in which the plastic covering that constitutes the component body of components 4a is applied, and specifically preferably again by molding under pressure. After this, rodlike blank 29 is split into individual components 4a, specifically at the joint spots between plates 6 (layers 30). Here the fastener is one which, for example, with heating easily allows a splitting of blank 29 into individual components 4a. As a fastener, for example wax or a plastic or adhesive that becomes soft under the effect of heat is used. But preferred as a fastener is a solder with a low melting point so that, with this fastener, a solder coating of plates 6 on their exposed surfaces is simultaneously achieved. In this embodiment, metal or material strips 23 and 24 are already preferably connected to each other with this fastener on their surfaces facing each other.

FIG. 9 shows, in perspective representation, a component 4b obtained by shaping using a MELF component 1, a component 4b which, in the same way as component 4a, on surface areas 5 of its component body, does not exhibit longitudinal grooves 8 but in which plates 6 do not have recesses 7 either.

To produce this component 4b, MELF components 1 are fed by a transport element 31 to a work station 32. Transport element 31 has supports 31' for MELF components 1 in the form such that each MELF component 1 lies with its longitudinal axis perpendicular to conveyance direction E of transport element 31 and adjacent MELF components 1 on transport element 31 in transport direction E exhibit, in each case, an equal, set distance from each other. Transport element 31 which, in the embodiment represented in FIGS. 10 to 12 is a conveyor band or conveyor belt, is further constructed so that MELF components 1, with their ends exhibiting front contact surfaces 3, project beyond the longitudinal sides of this transport element 31.

Whenever a certain number of MELF components 1 has reached work station 32, the movement of transport element 31 is stopped. At work station 32 a number of plates 6 is also ready then that corresponds to the number of MELF components 1, specifically there is, on each end exhibiting front contact surface 3 of each MELF component 1, a plate that lies with its plane perpendicular to the longitudinal extension of respective MELF component 1. Here plates 6 are provided on support strips 33 that are fed to work station 32 so that there is, at this work station, in each case, such a support strip 33 on which plates 6 are provided in the longitudinal direction of the support strip at the same distance that is exhibited by MELF components 1 on transport element 31. In the embodiment represented, plates 6 are fastened by bars 34 to a longitudinal side of support strip 33 in each case so that plates 6 project beyond this longitudinal side of support strip 33 and plates 6, support strip 33 and bars 34 are produced as one piece from the same material (sheet metal). In respective support strip 33, openings 35 are provided that constitute a perforation and that make it possible to feed support strips 33 to work station 32 so that with a transport element 31 stopped in its movement each plate 6 lies exactly adjacent to a face end of a MELF component 1 and specifically, especially also so that the longitudinal axis of each MELF component 1 intersect the center of both plates 6 adjacent to the ends of this MELF part 1.

The individual MELF components 1 located in work station 32 are then connected on their two front contact surfaces 3 to respective plate 6, which occurs also in this embodiment preferably again with the aid of a contact adhesive that is applied either on front contact surfaces 3 of MELF components 1, and specifically preferably before these MELF components 1 reach work station 32, or are also applied on plates 6, and specifically preferably before the latter reach work station 32. The conductive adhesive here can be an adhesive that can harden by UV light. In this case, plates 6 have in their middle an opening 36 into which, by pressing plates 6 against contact surface 3 in each case [word or words missing]flows, so that in the area of each opening 36, but also on the periphery of front contact surfaces 3, adhesive areas 37 and 38 result between each plate 6 and MELF component 1 and the adhesive areas are exposed and can be hardened by the UV light.

As soon as MELF components 1 located in work station 32 are connected to plates 6 of both support strips 33, i.e., by using a conductive adhesive after hardening of this adhesive, the suitable length is separated from each support strip 33. The blank thus obtained, which consists of two parallel lengths of support strips 33 with plates 6 provided on them and with MELF components 1 fastened on them, is then inserted into a mold in which MELF components 1 are embedded in the plastic compound or preferably, under pressure, the component bodies of individual components 4b are molded. After this molding process, individual components 4b are separated from the two support strip lengths, and specifically in the embodiment represented by splitting bars 34. In the embodiment described above, in each work operation a multiplicity of components 4b are thus obtained simultaneously. Basically it is of course also possible that in each work operation in each case only one MELF component 1, is provided on both its front contact surfaces 3 with a plate 6 in each case and next the mold to incorporate MELF component 1 in the plastic compound and for formation of the component body of component 4b is fed.

The invention was described above based on embodiments. Of course, other changes and modifications are possible without leaving the basic concept of the invention.

I claim:

1. A process for transforming a cylindrical electrical part into a component having at least one flat surface, suitable for use as a surface mounted device, comprising steps of forming metal plates having a shape corresponding to a desired final cross-section of the transformed component, fastening one such metal plate to each longitudinally opposite end of said part so that both metal plates lie perpendicular to the longitudinal axis of the part, and extend radially beyond the peripheral surface of said part, at either end of an area corresponding to each flat surface of the transformed component, and filling the space between the metal plates with a hard-setting, electrically insulating compound that forms the outer peripheral surface of the transformed component in such a way that this compound forms at least one flat outer surface, said fastening and filling being performed by the steps of the first inserting at least one metal plate into a mold, next inserting said part to be transformed into said mold, and then inserting at least one further metal plate into said mold, with said part being held in said mold at a distance from the wall of the mold enclosing said part and said metal plates.

2. A process according to claim 1, wherein, in the fastening step, the plates are attached to the part with a conductive adhesive.

3. A process according to claim 1, wherein said electrically insulating compound is a plastic.

4. A process according to claim 1, wherein the plates are larger than the cross section of the part to be transformed and are fastened to said part so that their entire peripheries extend radially beyond the periphery of said part and wherein the compound of electrically insulating material is applied so that said part is completely enveloped by this compound.

5. A process according to claim 1, wherein said plates, on their surfaces that abut the ends of a part after insertion into a mold, are coated, before insertion into the mold, with a coating that produces an adhesive bond between said plates and the part.

6. A process according to claim 1, wherein the compound of electrically insulating material is injected into the mold space.

7. A process according to claim 1, wherein the area between the metal plates is filled with the electrically insulating compound so that the peripheral surface of both metal plates are exposed on said at least one flat surface of the transformed component.

8. A process according to claim 1 wherein said mold comprises a core having an open end and an opposite, closed end, and wherein the inserting step includes inserting two metal plates and one part alternatingly in sequence, the series of parts and metal plates thus formed inside the core being moved from the closed end of core to the open end thereof.

9. A process according to claim 8, wherein the electrically insulating compound forming said flat surface of the transformed component is inserted in a section of said core lying in between the two ends of said core.

10. A process for transforming a cylindrical electrical part into a component having at least one flat surface, suitable for use as a surface mounted device, comprising steps of forming metal plates to a shape corresponding to a desired cross-section of the transformed component, fastening one such metal plate to each of opposite ends of said part so that the metal plates on both ends lie perpendicular to the longitudinal axis of the parts, and extend radially beyond the peripheral surface of said part, at either end of an area corresponding to each flat surface of the transformed component, and filling the space between the metal plates with a hard-setting, electrically insulating compound that forms the outer peripheral surface of the transformed component in such a way that this compound forms at least one flat surface of the transformed component, with said step of filling being performed by first producing a blank comprising a part to be transformed and two metal plates fastened to the ends of this part, inserting the blank into a mold, and then filling the area between the two metal plates with the electrically insulating material, with said blank comprising at least two parts, each having two metal plates fastened on the ends thereof and with said parts being connected by said metal plates to said blank.

11. A process according to claim 10, wherein at least two parts are provided in a blank, one behind the other, along an axis perpendicular to said plates and wherein two plates between adjacent parts are detachably connected to each other.

12. A process according to claim 10, wherein each part is maintained by flangelike projections extending from a surface of said mold at a distance from this surface sufficient for a connection between said part and respective plates to be obtained.

13. A process according to claim 10, wherein said blank comprises at least two parts extending parallel to each other, and wherein the plates on one end of said parts are interconnected by a first support strip section and, on the other end of said parts, by a second support strip section.

14. A process according to claim 13, wherein at least two support strips and at least one part to be transformed in each case are fed to a processing station so that at least one part lies with its ends between one plate on one support strip and one plate on the other support strip, and wherein the plates adjacent to the ends of at least one part and provided on support strips are fastened to these ends.

15. A process according to claim 14, wherein said support strips and parts are fed to a work station so that, after feeding, in each case, at least two parts are arranged between two plates in each of two support strips.

16. A process according to claim 10, wherein plates are produced by separating a front section of at least one material strip.

17. A process according to claim 16, wherein to produce said plates, the front sections of two facing material strips are separated.

18. A process according to claim 16, wherein to produce said plates, the front sections of two facing material strips are separated, the material strips being detachably connected to each other on their surface sides facing each other.

19. A process according to claim 16, wherein plates are pushed into a core immediately after the separation of at least the one material strip, preferably by a ram used for the separation.

20. A device for transforming a cylindrical electrical part into a component having at least one flat surface, suitable for use as a surface mounted device, comprising
  means for forming metal plates to a shape corresponding to a desired cross-section of the transformed component,
  means for fastening such a metal plates to each of opposite ends of said part so that the metal plates on both ends lie perpendicular to the longitudinal axis of the parts, and extend radially beyond the peripheral surface of said part, at either end of an area corresponding to each flat surface of the transformed component, and
  means for filling the space between the metal plates with a hard-setting, electrically insulating compound that forms the outer peripheral surface of the transformed component in such a way that this compound forms at least one flat surface of the transformed component, and
  a conveyor having at least one recess for transporting parts to be transformed from a delivery station to a work station, said work station comprising means for feeding and attaching metal plates to each part to be transformed.

21. A device according to claim 20, wherein said conveyor has a plurality of recesses.

22. A device according to claim 20, wherein at least the one recess is designed so that a part to be transformed lies with its longitudinal extension transverse to the conveying direction of the conveyor.

23. A device according to claim 20, wherein the conveyor is driven intermittently in the transport direction.

24. A device according to claim 20, wherein the conveyor is a rotating element provided with at least the one recess.

25. A device according to claim 20, comprising means for feeding a material strip to the work station on the side opposite the mold and for separating one front section as plate, from the material strip and for pushing it into a mold.

26. A device according to claim 20, further comprising means for feeding two material strips, lying on one another like a stack, to the work station.

27. A device according to claim 20, further comprising means for attaching an adhesive to the two ends of a part to be transformed and/or to a surface side of plates.

28. A device according to claim 20, further comprising means, at the work station, for feeding at least one support strip in succession with plates in the longitudinal direction of the support strip.

29. A device according to claim 28, wherein two support strips on both sides of transport element are fed to work position so that, in each case, at least one plate of each support strip lies directly adjacent to one end of a part that is placed in a support of transport element.

30. A device according to claim 20, further comprising a mold in the form of a core at the work station, and means for inserting plates and the part to be transformed into the mold or forming space.

31. A device according to claim 30, wherein the mold is provided on a side of the conveyor that lies in transport direction of this conveyor and has an opening which, when at least the one recess reaches the work position, is coincident with the recess.

32. A device according to claim 30, wherein the cross section of the mold is the same as the peripheral cross section of the plates.

33. A device according to claim 30, wherein at least one other core for feeding the compound of electrically insulating material empties into the mold or forming space of into the core, whose one, open end lies adjacent to the transport element.

34. A device according to claim 30, further comprising projection on wall surfaces adjacent to the mold, said projections, reaching inward into the mold or forming space, and wherein the distance that the exposed ends of opposite projections stand from each other equals the diameter of the part to be transformed.

35. A device according to claim 30, further comprising, perpendicular to transport direction of transport element, a reciprocable cutting punch for separating plates from a material strip and for pushing these plates into the mold.

36. A device according to claim 30, wherein the mold exhibits a square or rectangular cross section.

37. A device according to claim 36, comprising a projection on every surface adjacent to the mold.

* * * * *